United States Patent
Suenaga

(10) Patent No.: US 7,078,285 B1
(45) Date of Patent: Jul. 18, 2006

(54) SIGE NICKEL BARRIER STRUCTURE EMPLOYED IN A CMOS DEVICE TO PREVENT EXCESS DIFFUSION OF NICKEL USED IN THE SILICIDE MATERIAL

(75) Inventor: Jun Suenaga, Fishkill, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 11/040,781

(22) Filed: Jan. 21, 2005

(51) Int. Cl.
*H01L 21/8238* (2006.01)

(52) U.S. Cl. ............... 438/199; 438/300; 438/303; 438/653

(58) Field of Classification Search ........ 438/199–202, 438/287–307, 648–655
See application file for complete search history.

(56) References Cited

U.S. PATENT DOCUMENTS

| | | | |
|---|---|---|---|
| 6,531,347 B1 * | 3/2003 | Huster et al. | 438/164 |
| 2003/0003651 A1 | 1/2003 | Divakaruni et al. | 438/243 |
| 2003/0011080 A1 | 1/2003 | Deshpande et al. | 257/900 |
| 2003/0080283 A1 | 5/2003 | Clark, Jr. et al. | 257/347 |
| 2003/0141534 A1 | 7/2003 | Coolbaugh et al. | 257/309 |
| 2004/0014304 A1 | 1/2004 | Bhattacharyya | 438/570 |
| 2004/0071879 A1 | 4/2004 | Callegari et al. | 427/255.28 |
| 2004/0094804 A1 | 5/2004 | Amos et al. | 257/369 |
| 2004/0132236 A1 | 7/2004 | Doris et al. | 438/182 |
| 2004/0135212 A1 | 7/2004 | Dokumaci et al. | 257/376 |
| 2004/0266182 A1 | 12/2004 | Ku et al. | 438/682 |

* cited by examiner

*Primary Examiner*—H. Jey Tsai
(74) *Attorney, Agent, or Firm*—Mayer & Williams PC; Stuart H. Mayer, Esq.; Karin L. Williams, Esq.

(57) ABSTRACT

A CMOS device such as an NFET or a PFET and a method of forming a CMOS device are provided. The method begins by forming at least one patterned gate region atop a first semiconductor layer that includes silicon. Dielectric spacers are formed about exposed portions of the patterned gate region. Source-drain regions are formed in the first semiconductor layer. Recesses are formed in the first semiconductor layer that extends under the dielectric spacers. The first semiconductor layer has exposed surfaces that in part define sidewalls of the recesses. A nickel barrier layer is formed on each of the exposed surfaces of the first semiconductor layer. The nickel barrier layers are etched so that the nickel barriers remain only on portions of the exposed surfaces located under the dielectric spacers and not on remaining portions of the exposed surface. A silicon-containing layer is formed on the remaining exposed surfaces of the first semiconductor layer. Silicide layers are formed on the silicon-containing layers, wherein the silicide layer includes nickel.

7 Claims, 16 Drawing Sheets

SIGE NICKEL BARRIER STRUCTURE EMPLOYED IN A CMOS DEVICE TO PREVENT EXCESS DIFFUSION OF NICKEL USED IN THE SILICIDE MATERIAL

FIELD OF THE INVENTION

The present invention relates generally to CMOS devices and more particularly to CMOS devices such as NFETs and PFETs in which a nickel barrier structure is employed to prevent excess diffusion of nickel into the channel region of the devices.

BACKGROUND OF THE INVENTION

As the integration density of semiconductor devices continues to increase and the critical dimensions associated with such devices continue to decrease, there has been a corresponding increase in interest in identifying materials and processes for producing interest in low resistance materials to maintain or reduce signal delay. Silica and salicide (self-aligned silicide) materials and processes have been widely used to lower the sheet resistance and contact resistance for the gate conductor and source/drain regions of CMOS devices.

A number of metals, including tungsten, tantalum, zirconium, titanium, hafnium, platinum, palladium, vanadium, niobium, cobalt, nickel and various alloys of such metals have been used to form silicide layers on semiconductor devices. For gate lengths below about 100 nm, however, conventional salicide processes and materials tend to experience a variety of difficulties including opens, residues and layer non-uniformity, resulting at least in part from agglomeration within the silicide material layer.

These difficulties tend to be exacerbated by the high-temperature processing required to react most metal(s) with silicon to form the desired silicide layers. The high temperature anneals required also raise concerns regarding the impact of the silicide annealing process(es) on the thermal budget for the devices being manufactured. For example, when cobalt is used to form the silicide, the initial stoichiometry of the silicide may be generally represented as CoSi, but as the annealing process continues, particularly at higher temperatures, the silicide tends to incorporate an increasing amount of silicon and approaches a composition more closely represented as $CoSi_2$ For devices having gate lengths below about 100 nm, however, the second high temperature silicidation used in conventional Co salicide processes tends to induce agglomeration within the silicide material layer, increasing the degree of non-uniformity within the layer and tending to degrade the performance of the resulting devices.

Nickel is an attractive metal for forming silicides because the annealing process required to form the desired silicide may be conducted at a relatively low temperature, e.g., below about 550 C. Due to the low silicidation temperature, NiSi exhibits a decreased tendency to agglomerate and form a silicide layer with a low sheet resistance that is generally independent of the device dimensions, increasing its utility for lowering the resistance of fine line structures.

One problem with the use of nickel in the silicides employed in CMOS devices arises from its relatively high diffusion coefficient. As a result nickel diffuses into the channel region located the gate conductor. This encroachment by the nickel into the body region degrades device performance.

Accordingly, it would be desirable to provide a CMOS device in which nickel employed in the silicide material is prevented from encroaching on the channel region by diffusion.

SUMMARY OF THE INVENTION

In accordance with the present invention, a CMOS device and a method of forming a CMOS device are provided. The method begins by forming at least one patterned gate region atop a first semiconductor layer that includes silicon. Dielectric spacers are formed about exposed portions of the patterned gate region. Source-drain regions are formed in the first semiconductor layer. Recesses are formed in the first semiconductor layer that extends under the dielectric spacers. The first semiconductor layer has exposed surfaces that in part define sidewalls of the recesses. A nickel barrier layer is formed on each of the exposed surfaces of the first semiconductor layer. The nickel barrier layers are etched so that the nickel barriers remain only on portions of the exposed surfaces located under the dielectric spacers and not on remaining portions of the exposed surface. A silicon-containing layer is formed on the remaining exposed surfaces of the first semiconductor layer. Silicide layers are formed on the silicon-containing layers, wherein the silicide layer includes nickel.

In accordance with one aspect of the invention, the CMOS device is an NFET.

In accordance with another aspect of the invention, the CMOS device is an PFET and the silicon-containing layer includes Ge.

In accordance with another aspect of the invention, the CMOS device is a PFET and the silicon-containing layer is doped with a p-type dopant.

In accordance with another aspect of the invention, the nickel barrier layer comprises SiGe.

In accordance with another aspect of the invention, the SiGe is epitaxial SiGe.

In accordance with another aspect of the invention, the step of forming silicide layers comprises the step of depositing nickel or a nickel alloy on the silicon-containing layer. The nickel or nickel alloy is annealed to react with underlying silicon to thereby form the silicide layers

DETAILED DESCRIPTION

Figure 1:
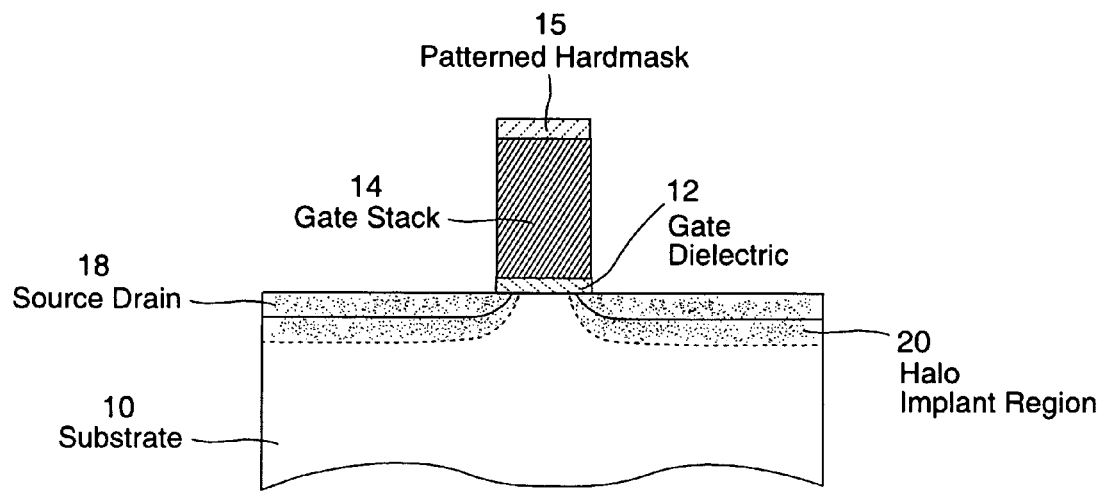
FIGS. 1 through 8 show in a cross-sectional schematic view a process flow that may be employed to form a CMOS device in accordance with one embodiment of the present invention.

FIG. 1 illustrates an initial structure that is employed in the present invention. The initial structure shown in FIG. 1 comprises semiconductor substrate 10, patterned gate dielectric 12 formed on a portion of semiconductor substrate 10, and patterned gate stack 14 formed atop patterned gate dielectric 12. It is noted that although the drawings depict the presence of only one patterned gate region (i.e., patterned gate dielectric and patterned gate stack) on the semiconductor substrate, the present invention works in cases wherein a plurality of patterned gate regions are present on the semiconductor substrate, generally separated by trench isolation regions.

The structure shown in FIG. 1 is comprised of conventional materials well known in the art and the illustrated structure is fabricated utilizing processing steps that are also well known in the art. For example, semiconductor substrate 10 is comprised of a semiconductor material including, but not limited to: Si, Ge, SiGe, GaAs, InAs, InP and all other III/V semiconductor compounds. Semiconductor substrate 10 may also include a layered substrate comprising the same or different semiconductor material, e.g., Si/Si or Si/SiGe, as well as a silicon-on-insulator (SOI) substrate. The substrate may be of the n- or p-type depending on the desired device to be fabricated. Additionally, semiconductor substrate 10 may contain active device regions, wiring regions, isolation regions or other like regions that are typically present in CMOS-containing devices. For clarity, these regions are not shown in the drawings, but are nevertheless meant to be included within region 10.

Next, a layer of gate dielectric material such as an oxide, nitride, oxynitride or any combination and multilayer thereof is then formed on a surface of semiconductor substrate 10 utilizing a conventional process well known in the art. For example, the layer of gate dielectric material may be formed utilizing a conventional deposition process such as chemical vapor deposition (CVD), plasma-assisted CVD, evaporation or chemical solution deposition, or alternatively, the gate dielectric material may be formed by a thermal growing process such as oxidation, nitridation or oxynitridation. It is noted that the gate dielectric material will be subsequently patterned and etched into patterned gate dielectric 12 shown in FIG. 1.

The thickness of the layer of gate dielectric material is not critical to the present invention, but typically, the gate dielectric material has a thickness of from about 1 to about 20 nm after deposition, with a thickness of from about 1.5 to about 10 nm being more preferred. It is noted that the gate dielectric material employed in the present invention may be a conventional dielectric material such as $SiO_2$ or $Si_3N_4$, or alternatively, high-k dielectrics such as oxides of Ta, Zr, Al or combinations thereof may be employed. In one embodiment of the present invention, gate dielectric 12 is comprised of an oxide such as $SiO_2$, $ZrO_2$, $Ta_2O_5$ or $Al_2O_3$.

After forming the gate dielectric material on the surface of semiconductor substrate 10, gate stack 14 which includes at least a gate material is formed on the gate dielectric material. The term "gate material" as used herein denotes a conductive material, a material that can be made conductive via a subsequent process such as ion implantation, or any combination thereof. Illustrative examples of suitable gate materials include, but are not limited to: polysilicon, amorphous silicon, elemental metals that are conductive such as W, Pt, Pd, Ru, Rh and Ir, alloys of these elemental metals, silicide or nitrides of these elemental metals and combinations thereof, e.g., a gate stack including a layer of polysilicon and a layer of conductive metal.

The gate material is formed on the surface of the gate dielectric material utilizing a conventional deposition process including, but not limited to: CVD, plasma-assisted CVD, evaporation, plating or chemical solution deposition. When metal suicides are employed, a conventional silicide process may be used in forming the silicide layer. One such silicide process that can be used in the present invention includes the steps of: first forming an elemental metal on the gate dielectric material, annealing the layers so as to form a metal silicide layer therefrom, and removing any unreacted elemental metal utilizing a conventional wet etch process that has a high selectivity for removing elemental metal as compared to silicide. When polysilicon is employed as the gate material, the polysilicon layer may be formed utilizing an in-situ doping deposition process or by a conventional deposition process followed by ion implantation. Note that the ion implantation step may be formed immediately after deposition of the polysilicon layer, or in a later step of the present invention, i.e., after patterning of the gate stack.

After forming the gate stack on the gate dielectric material, the gate stack and the gate dielectric are then patterned utilizing conventional processing steps well known in the art which are capable of forming the patterned structure shown in FIG. 1. Specifically, the structure shown in FIG. 1 is formed by lithography and etching. The lithography step includes the following: applying a photoresist (not shown in the drawings) to the top surface of the gate stack, exposing the photoresist to a pattern of radiation and developing the pattern utilizing a conventional resist developer solution. The patterned photoresist is removed utilizing a conventional stripping process well known in the art providing the structure shown, for example, in FIG. 1. Patterned hardmask 15, e.g., a nitride, is then formed on the gate stack 14 by conventional deposition, lithography and etching.

Figure 2:
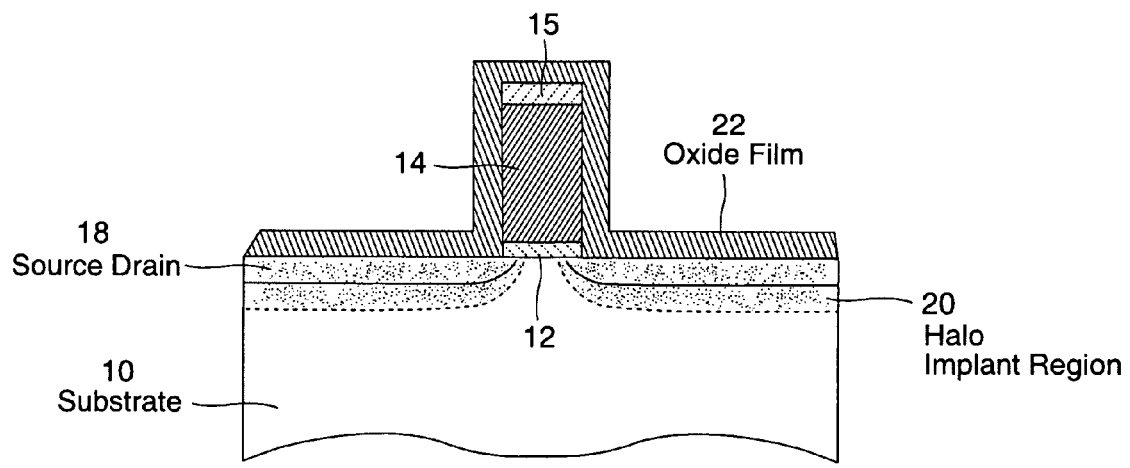

At this point of the present invention, source/drain extension and halo implants may be formed. Note in FIG. 1, region 18 denotes the source/drain extension regions and region 20 denotes the halo implant region. In other embodiment of the present invention, the source/drain extension and halo implant implants may be formed after the structure shown in FIG. 2 is formed. The deep source/drain diffusion regions (labeled as 16 in FIG. 3) are formed utilizing conventional processes (i.e., ion implantation and annealing) anytime after the structure shown in FIG. 3 is formed, i.e., after thick spacers 24 are formed in the structure.

FIG. 2 illustrates the structure after oxide film 22 is formed over the patterned gate stack structure of FIG. 1. The oxide film is formed utilizing any deposition process that is capable of depositing a film that follows the contour of the structure shown in FIG. 1. Specifically, CVD, plasma-assisted CVD, evaporation or chemical solution deposition may be employed in forming oxide film 22 on the structure. In some embodiments of the present invention, fluorine or nitrogen-containing dopants may be incorporated (via ion implantation or another conventional process) into oxide film 22 so as to alter the dielectric constant of oxide film 22. The thickness of oxide film 22 is not critical to the present invention, but typically oxide film 22 has a thickness of from about 2 angstroms to about 40 nm, with a thickness of from about 5 to about 10 nm being commonly employed. At this point of the present invention, an annealing step may be performed to activate the dopants, if implanted, and to possibly heal the implant damage. The activation-annealing step is conducted utilizing conditions well known in the art. For example, activation annealing at a temperature of about 900 C. or greater for a time period of about 30 seconds or less may be employed at this point of the present invention. Additionally, the various implants steps mentioned hereinabove may also be performed at this point of the present invention. Next, thick spacers 24, which may include a single spacer material or a combination of spacer materials, may be formed on the oxide film that abuts the patterned gate stack so as to provide the structure shown in FIG. 3. The thick spacers may be formed of a dielectric material other than an oxide. Specifically, the thick spacers may be formed of a nitride, an oxynitride or combinations and multilayers thereof.

The thick spacers are formed by a conventional deposition process such as CVD or plasma-assisted CVD, followed by etching. When the thick spacers are comprised of a combination of spacer materials, the spacer materials may be deposited sequentially followed by a single etching step, or alternatively, one spacer material is first deposited and etched, and thereafter a second spacer material is deposited and etched. This combination of spacer material deposition and etching may be repeated any number of times. The etching step used in forming thick spacers 24 is a highly anisotropic etching process which is capable of removing the spacer material from atop the oxide layer that lies above the patterned gate stack. The term "thick spacers" is used herein to denote spacers that have a thickness of from about 2 to about 100 nm, with a thickness of from about 20 to about 80 nm being more highly preferred. Moreover, oxide film 22 and thick spacers 24 need not be separate layers. Rather, a single spacer layer may be employed that encloses the patterned gate region. Alternatively, in some embodiments of the invention, multiple spacer layers may be employed.

Figure 3:
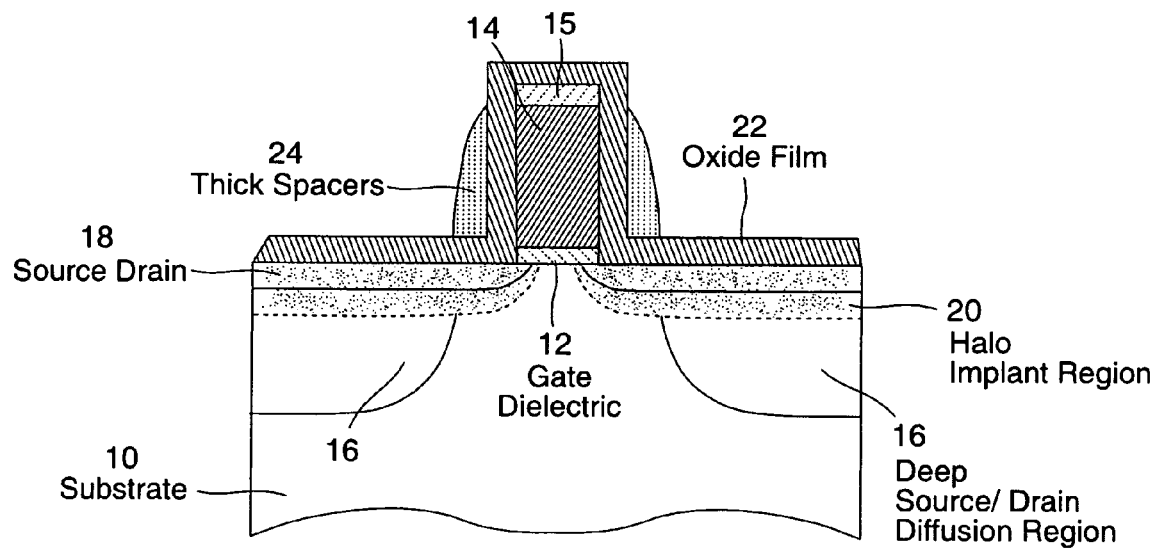
Figure 4:
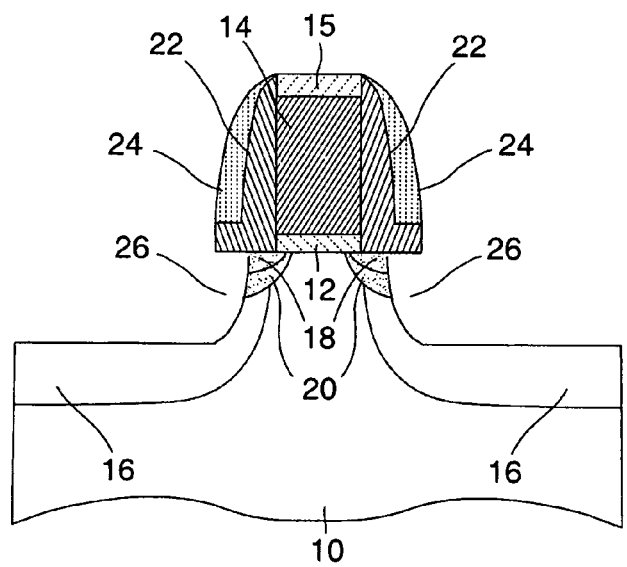

After forming thick spacers 24, the structure shown in FIG. 3 is then subjected to an etching step wherein substrate 10 is recessed below the uppermost horizontal edge of thick spacers 24 providing the structure shown, for example, in FIG. 4. Specifically, an etching step is employed in the present invention so as to provide recesses 26, which exist between the bottom of thick spacers 24 and the newly exposed upper surface of substrate 10. The recessing process includes lateral etching of substrate 10 to provide recess 26 between the thick spacers and semiconductor substrate 10. Note this recessing process also converts oxide film 22 into an L-shaped structures 23.

The etching process used in forming recesses 26 in the structure may include a wet chemical etch process or a dry etch process such as reactive ion etching. When wet etching is employed in the present invention in forming recesses 26, a chemical etchant is used that has a high selectivity for removing portions of the substrate 10 as compared with the thick spacer material.

Figure 5:
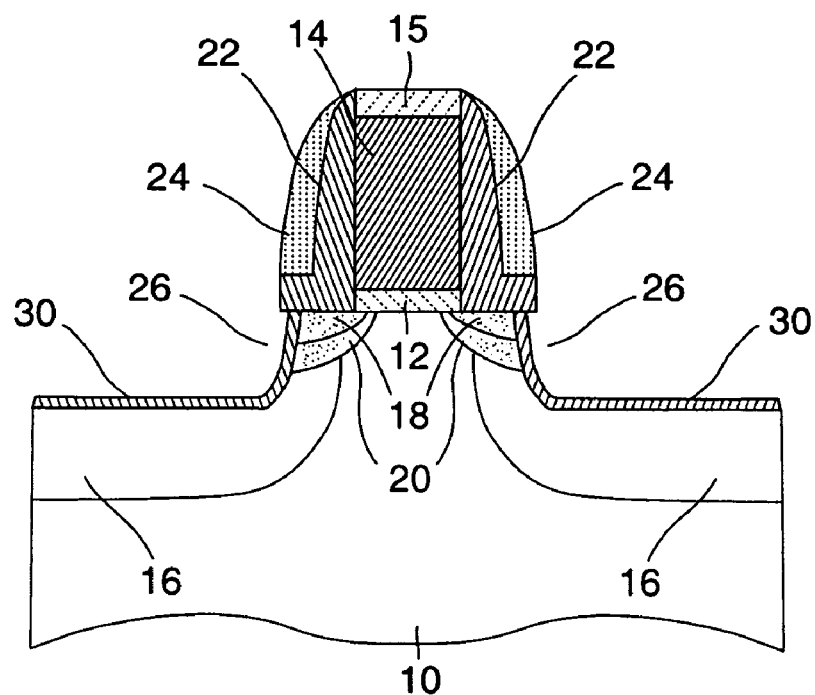

After forming recesses 26, a nickel barrier layer 30 is formed by a deposition process such as CVD or plasma-assisted CVD so as to provide the structure shown, for example, in FIG. 5. The nickel barrier material may be any appropriate material that services as a barrier to the diffusion of nickel during the subsequent silicidation process. One example of an appropriate material for nickel barrier layer 30 is SiGe, which may be formed epitaxially by any of the aforementioned processes. The thickness of the nickel barrier layer 30 is not critical to the present invention, but typically the thickness of the layer 30 is from about 1 to about 50 nm.

The nickel barrier layer 30 is next etched back by utilizing a dry etch process such as reactive ion etching that removes the barrier material from exposed horizontal surfaces so that the material is left under thick spacers 24. The etch back step results in the formation of the nickel barrier structures 30 shown in FIG. 6.

The aforementioned etch back step is employed to reduce the amount of epitaxial SiGe (e-SiGe) material that is incorporated into the device. This material reduction is important to device performance when the CMOS device being formed is an NFET. The e-SiGe gives rise to a compressive stress in the substrate 10 that causes the mobility of electrons to decrease. Accordingly, by keeping the amount of e-SiGe that is used to a minimum the adverse impact on the mobility of the electrons, and hence on device performance, can be minimized. On the other hand, when the CMOS device being formed is a PFET, the compressive stress caused by the e-SiGe causes the mobility of the holes to increase. In this case it may not be necessary to reduce the quantity of e-SiGe material since its presence may enhance device performance. In fact, as discussed below, it may be advantageous to increase the amount of e-SiGe material that is employed so as to enhance the mobility of the holes.

Figure 7:
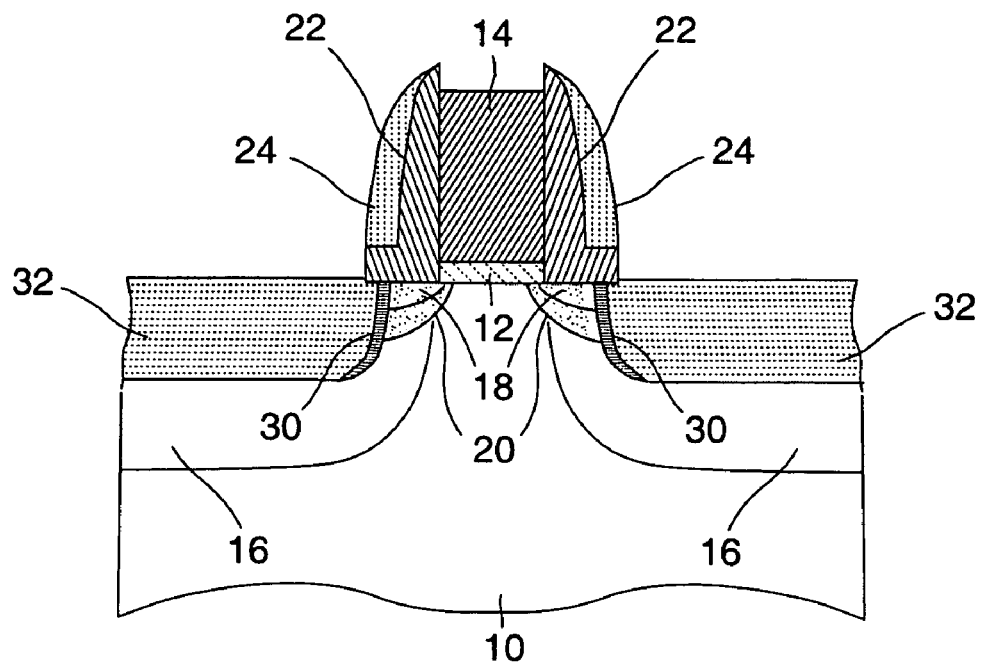

Next, as shown in FIG. 7, an epitaxial silicon layer 32 is formed on the exposed surface of substrate 10 and nickel barrier layer 30. The silicon layer 32 preferably has a thickness that at least allows its upper surface to be horizontal with the bottom of the thick spacer 24. In some embodiments of the invention the silicon layer 32 has an even greater thickness so that its upper surface is above the bottom of the thick spacer 24. At this point an etch step may be performed to remove hardmask 15, as FIG. 7 indicates.

As stated above, if not formed at a previous point, the deep source/drain diffusion regions 16 may be formed by utilizing conventional ion implantation and annealing processes well known in the art. The activation-annealing step is conducted utilizing conditions well known in the art.

The silicidation process is performed after the structure illustrated in FIG. 7 is formed. The silicidation process includes the steps of forming a refractory metal such as a nickel or a nickel alloy on the surface of semiconductor substrate 10, annealing the refractory metal under conditions that are capable of converting the refractory metal layer into a metal silicide layer, and, if needed, removing any non-reactant refractory metal from the structure. More specifically, in FIG. 8 a layer of a nickel or nickel alloy and is formed over the gate stack 14 and source/drain regions 32. The device may then be annealed at a temperature, typically above 350 C., and for a time period sufficient to cause the nickel alloy layer 34 to react with the silicon of the active region to form silicide 34 using, for example a rapid thermal anneal (RTP) process. Because the formation of the silicide is largely confined to those regions in which a silicon surface was exposed prior to the deposition of the nickel alloy 30, the silicide formation is often considered a self-aligned silicide (salicide).

Figure 8:
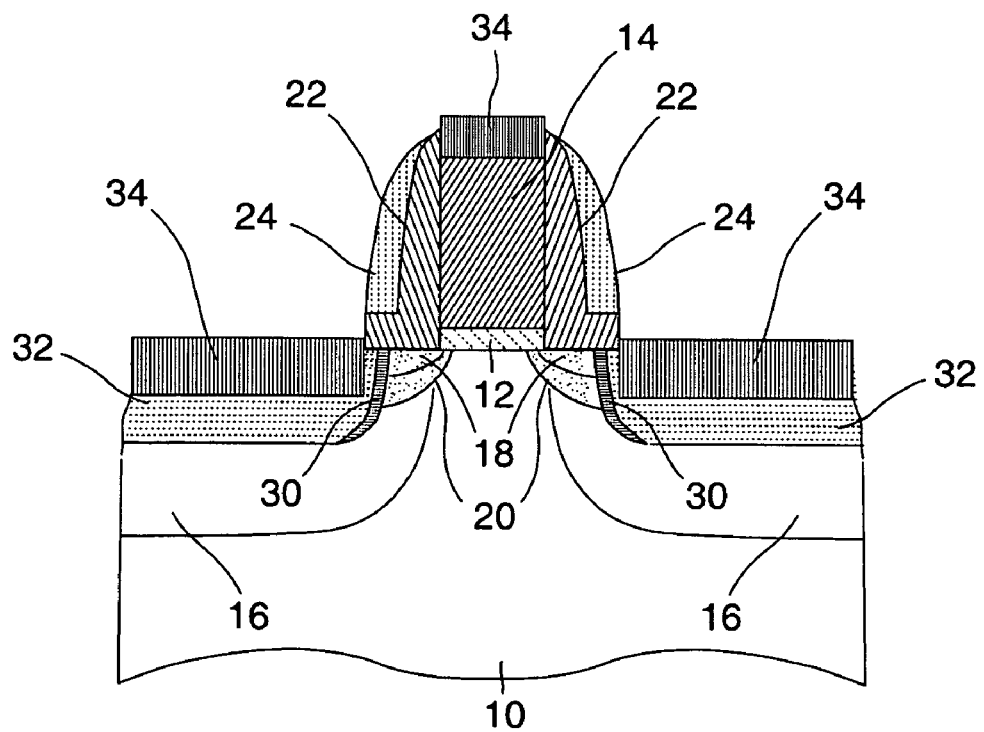

As further illustrated in FIG. 8, the unreacted portion of the nickel or nickel alloy layer 30, including those portions covering spacer 24, may be removed using, for example, a solution including sulfuric acid, $H_2SO_4$, and hydrogen peroxide, $H_2O_2$, leaving the silicide regions 34 on the surface of the source/drain regions within the active region.

As seen in FIG. 8, nickel barrier layer 30 prevents the lateral diffusion of the nickel or nickel alloy layer 34 into the portions of the 16 and 18 that extend beyond the barrier layer 30. In way nickel does not encroach into the channel region defined by the portion of substrate 10 located beneath gate oxide 12 and between the source-drain regions 16 and 18.

In addition to silicidation, the present invention also contemplates other well known CMOS processing steps that are typically employed in the prior art. For example, the present invention also contemplates forming a metal contact to the metal silicide layer, and connecting the metal contact to an external contact.

Figure 6:
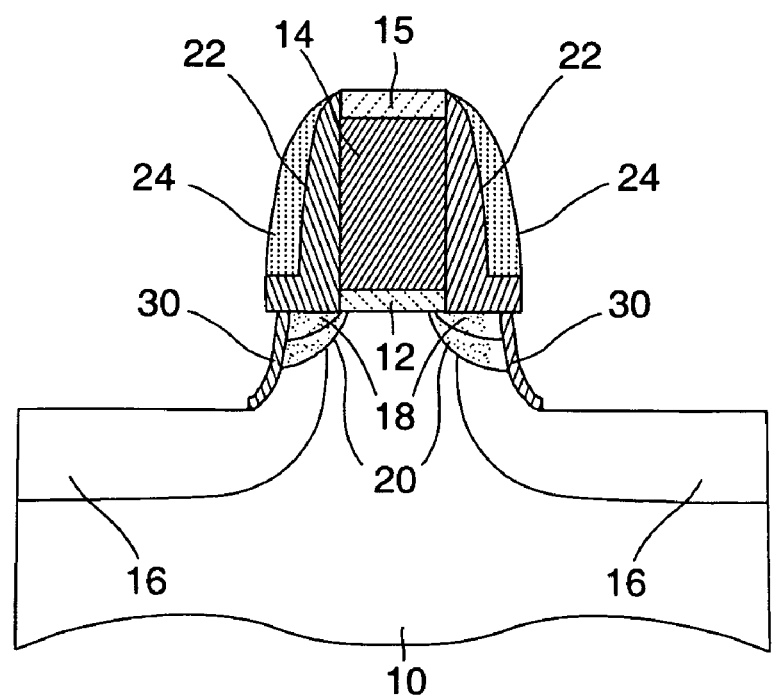

As previously mentioned, the etch back step used to reduce the quantity of the nickel barrier material that is employed is FIG. 6 is generally only necessary if the device being formed is an n-type structure such as an NFET. FIGS. 9–20 show an alternative embodiment of the invention in which both an n-type structure such as an NFET and a p-type structure such as a PFET is formed. This embodiment of the invention is presented to highlight the distinctions between the formation of the NFET and the PFET. Of course, the NFET and PFET need not be formed on the same substrate, but rather may be formed on separate substrates by appropriate processing steps.

In the embodiment of the invention shown in FIGS. 9–20, those regions and layers corresponding to the regions and layers in the embodiment of the invention shown in FIGS. 1–8 are denoted by the same reference numerals. Details of the processing steps and appropriate processing parameters are similar to those described above and thus will not be repeated below.

Figure 9:
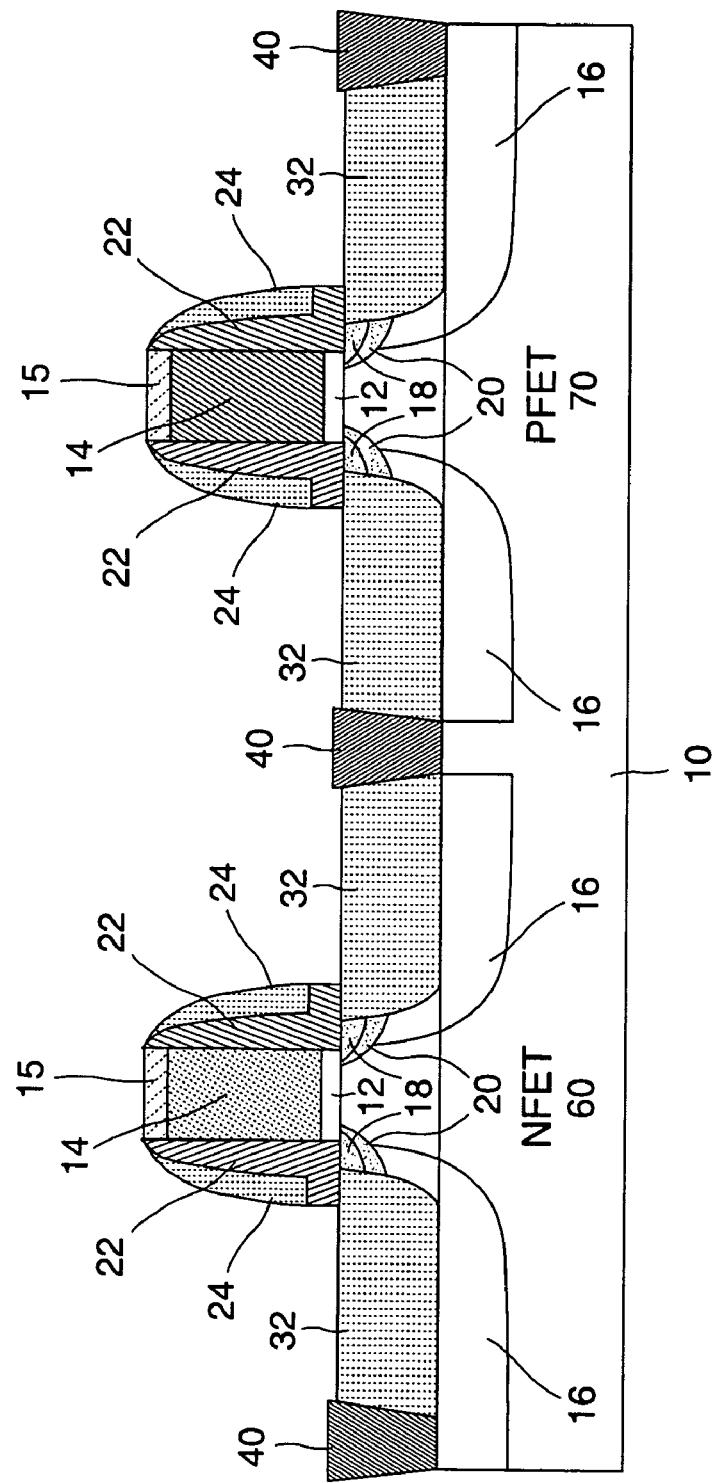
FIGS. 9 through 20 show in a cross-sectional schematic view a process flow that may be employed to form a CMOS device in accordance with another embodiment of the present invention.

FIG. 9 shows an NFET 60 and PFET 70 through the formation of the patterned gate region, thick spacer 24, source-drain extension regions 18, halo regions 20, and source-drain regions 16, which are formed on a common substrate 10 and separated by trench isolation regions 40.

Figure 10:
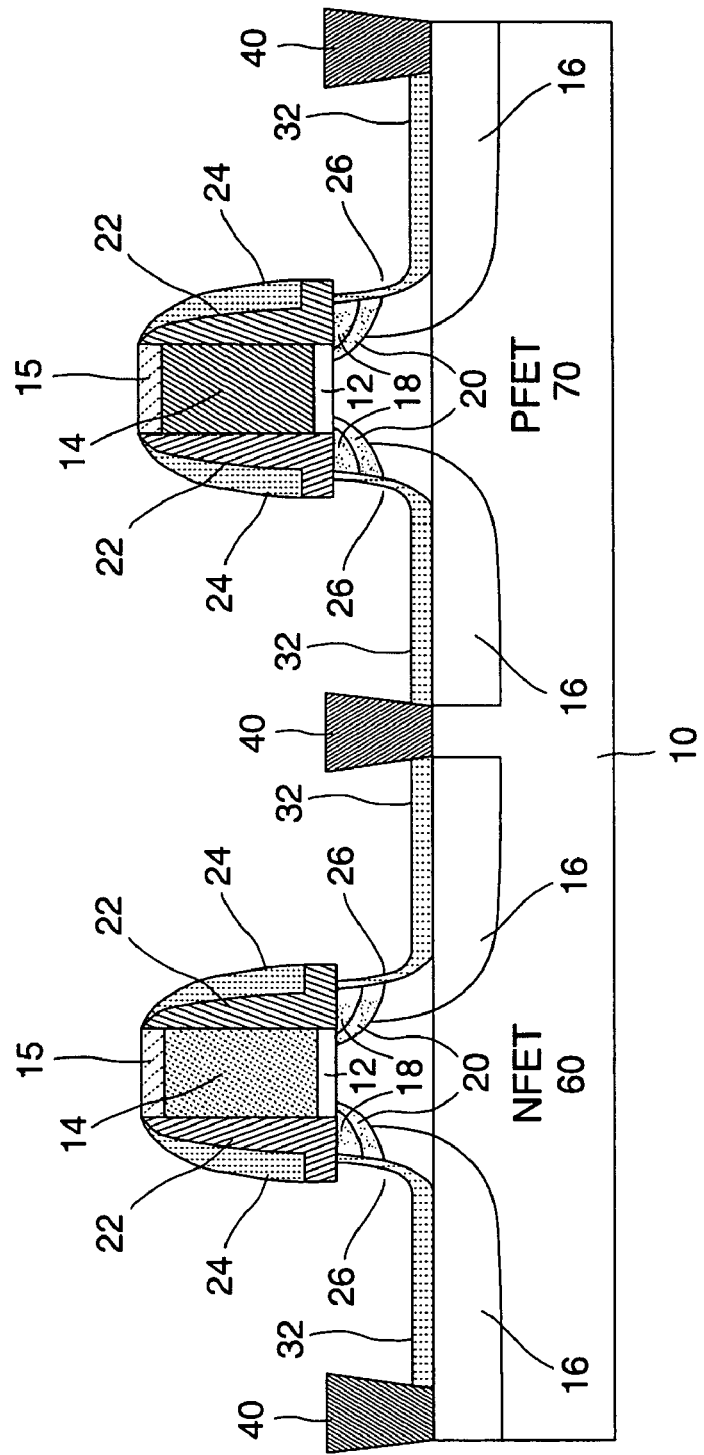
Figure 11:
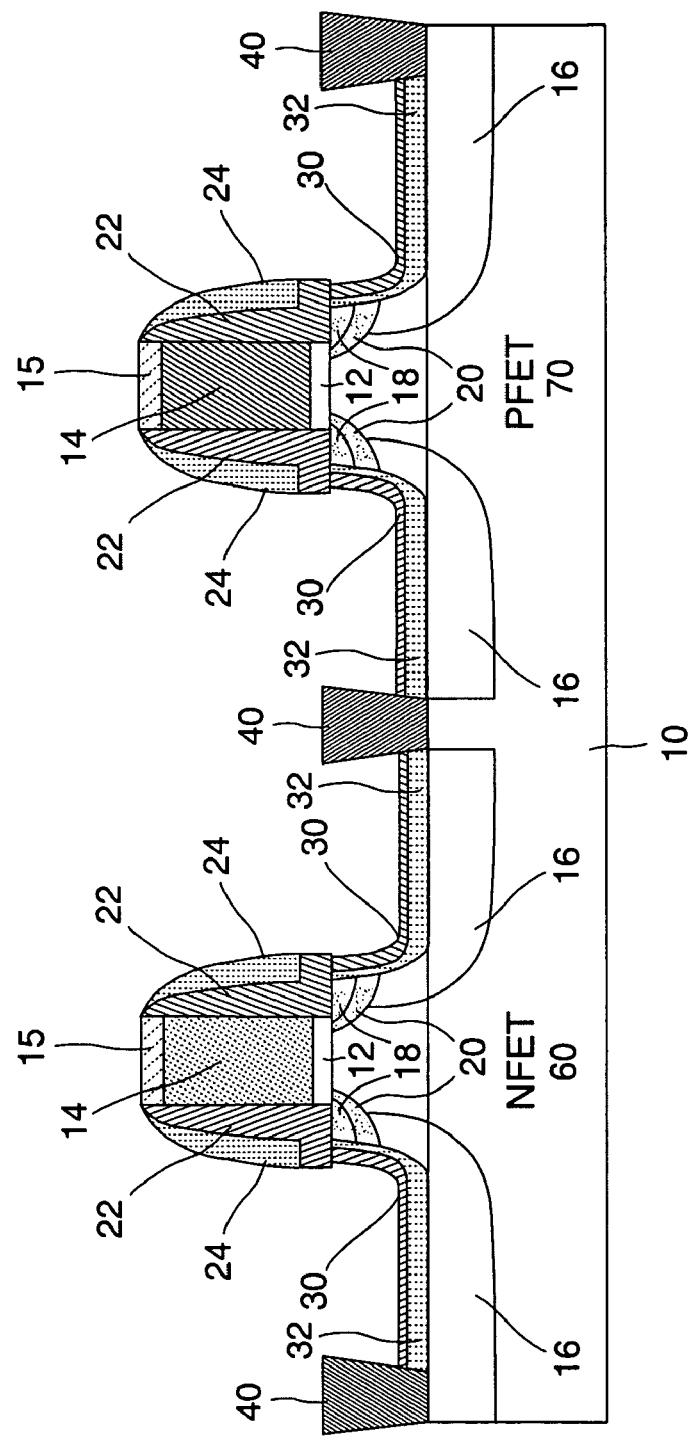
Figure 12:
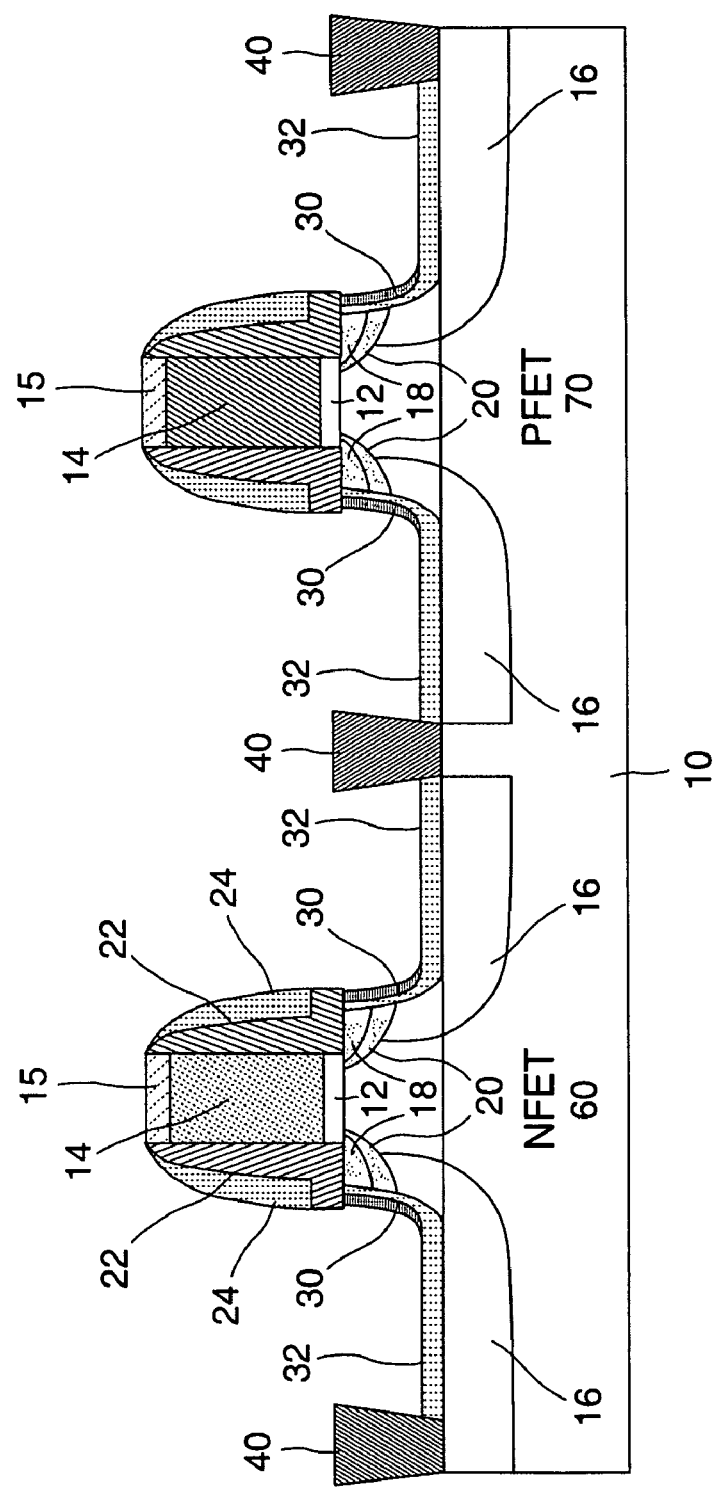
Figure 13:
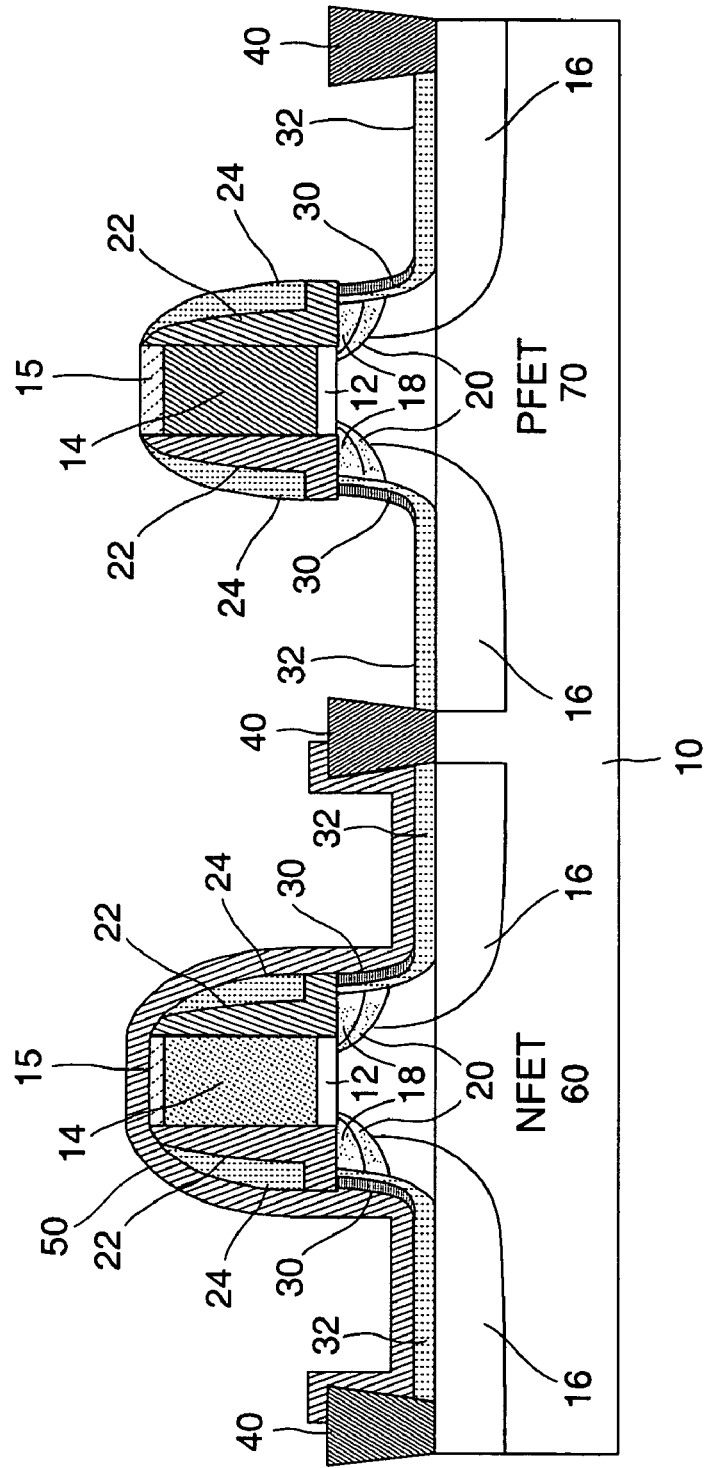
Figure 14:
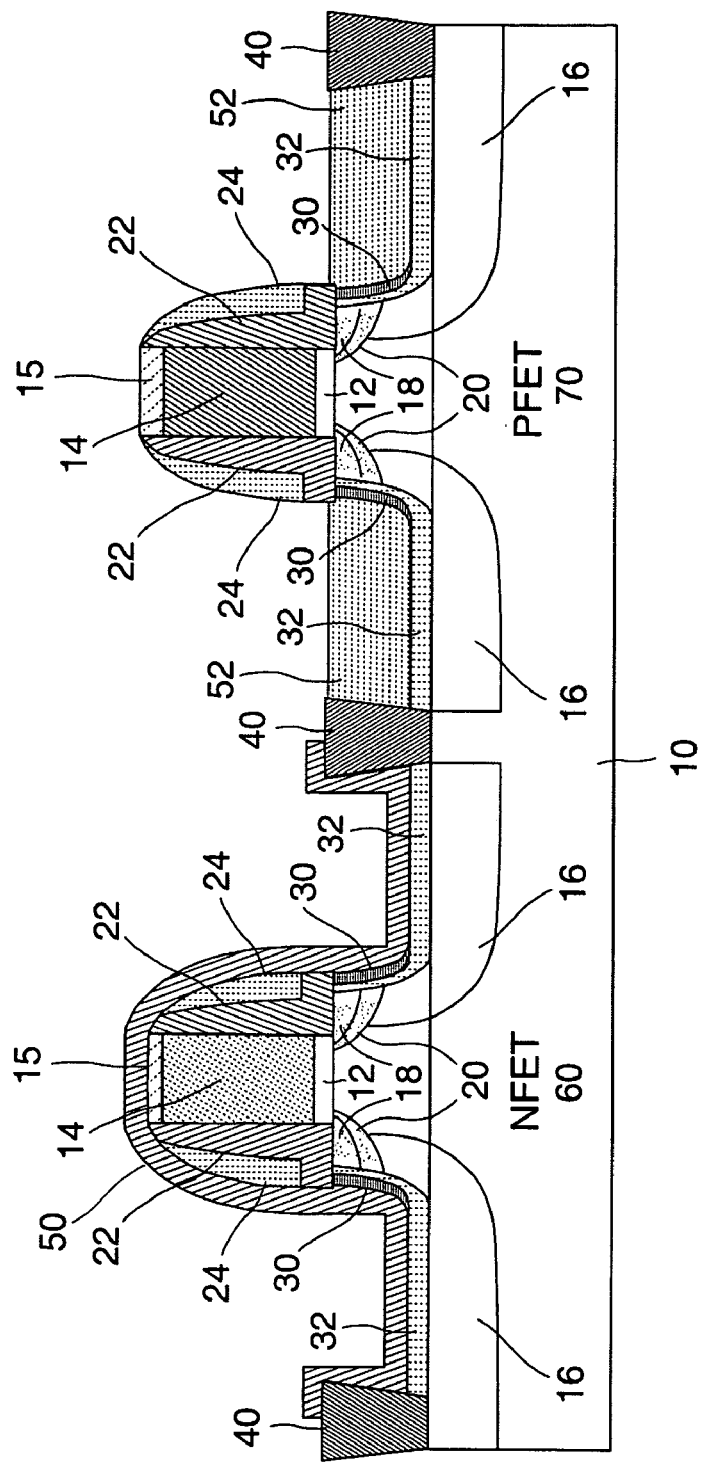
Figure 15:
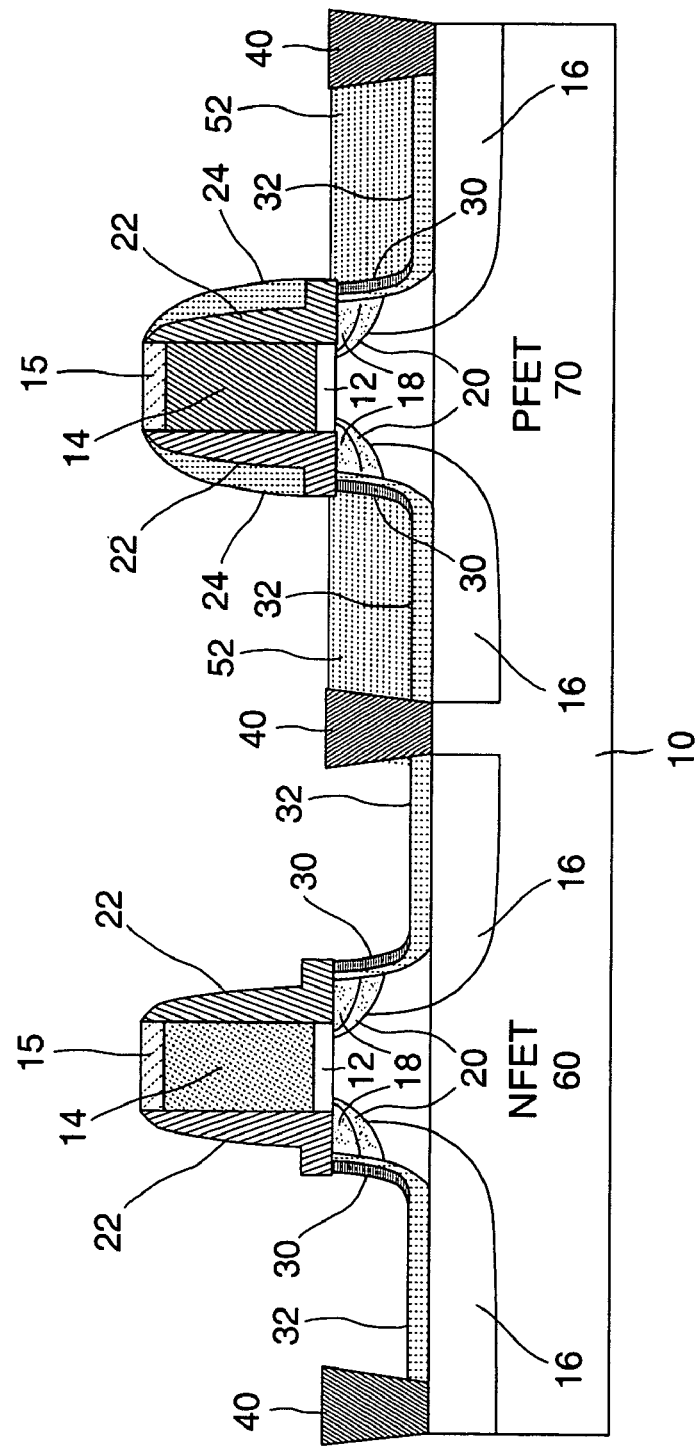
Figure 16:
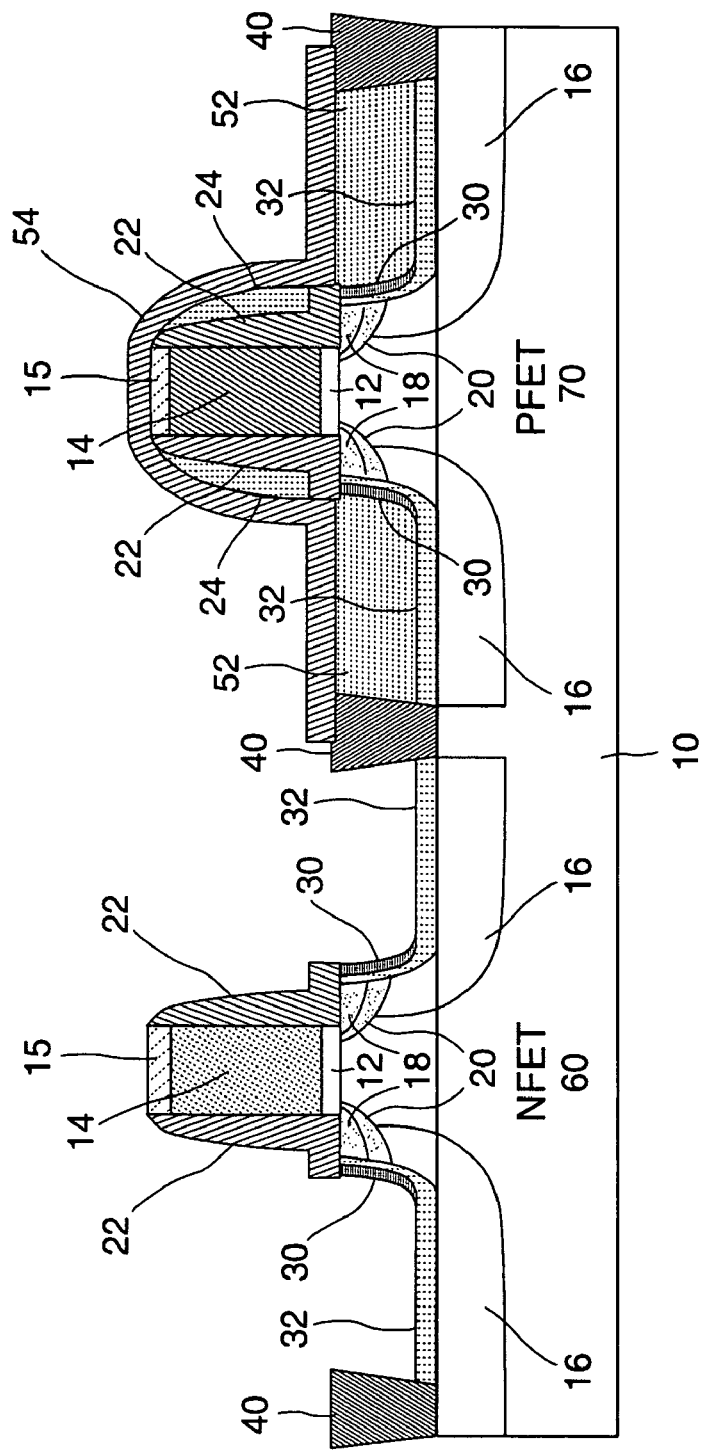
Figure 17:
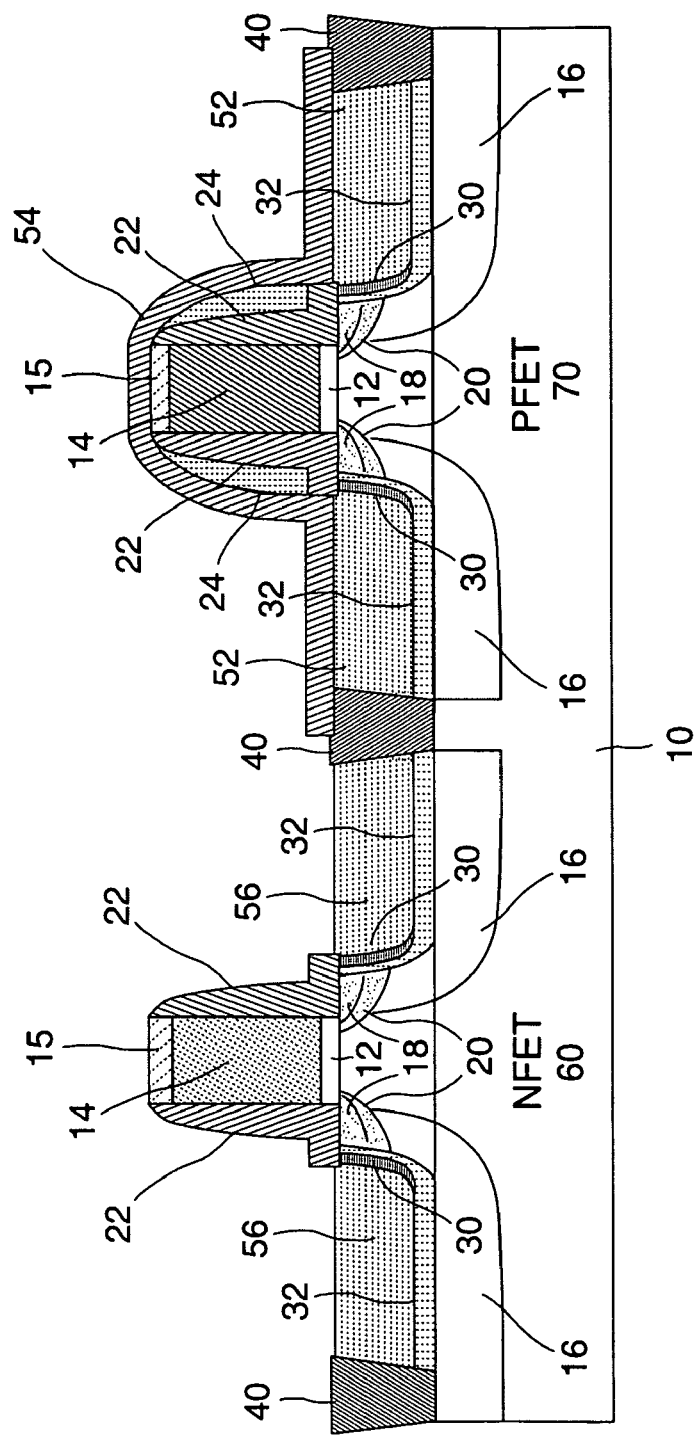
Figure 18:
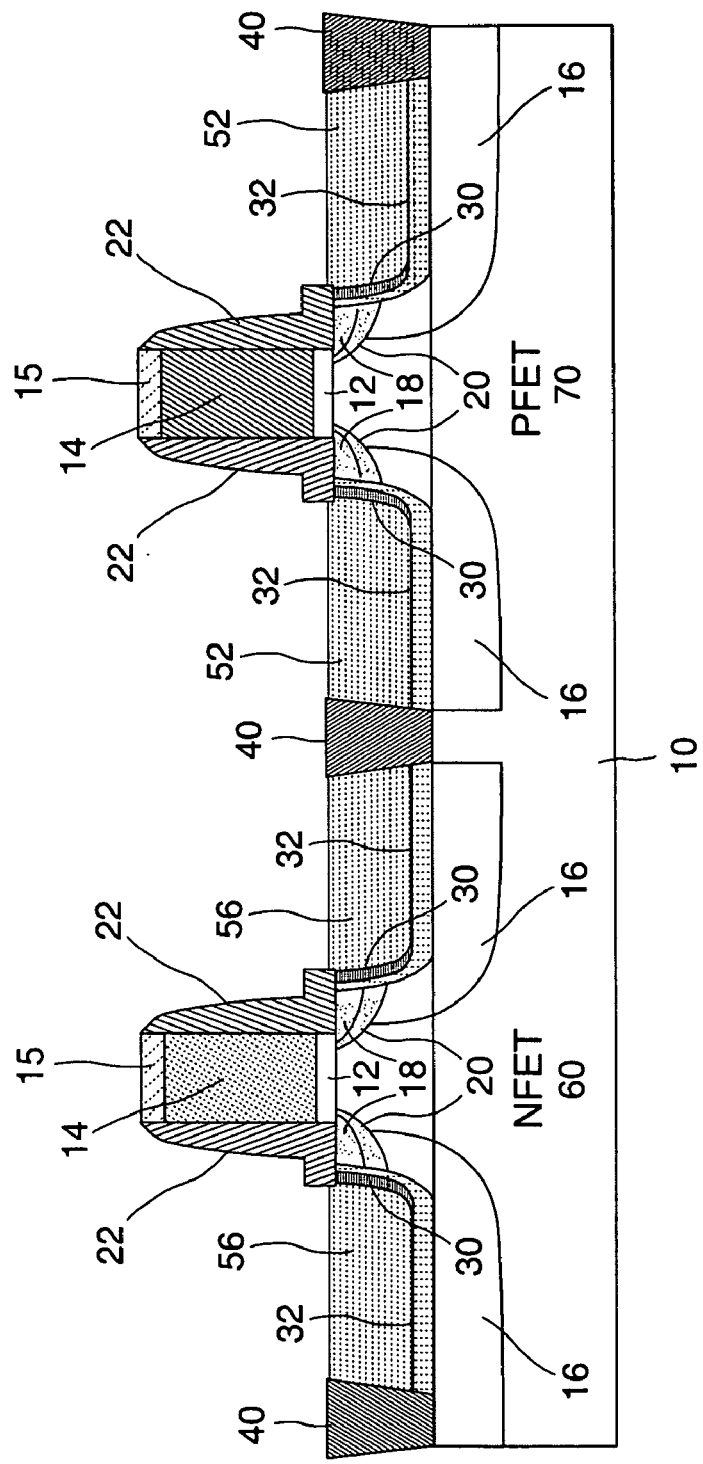
Figure 19:
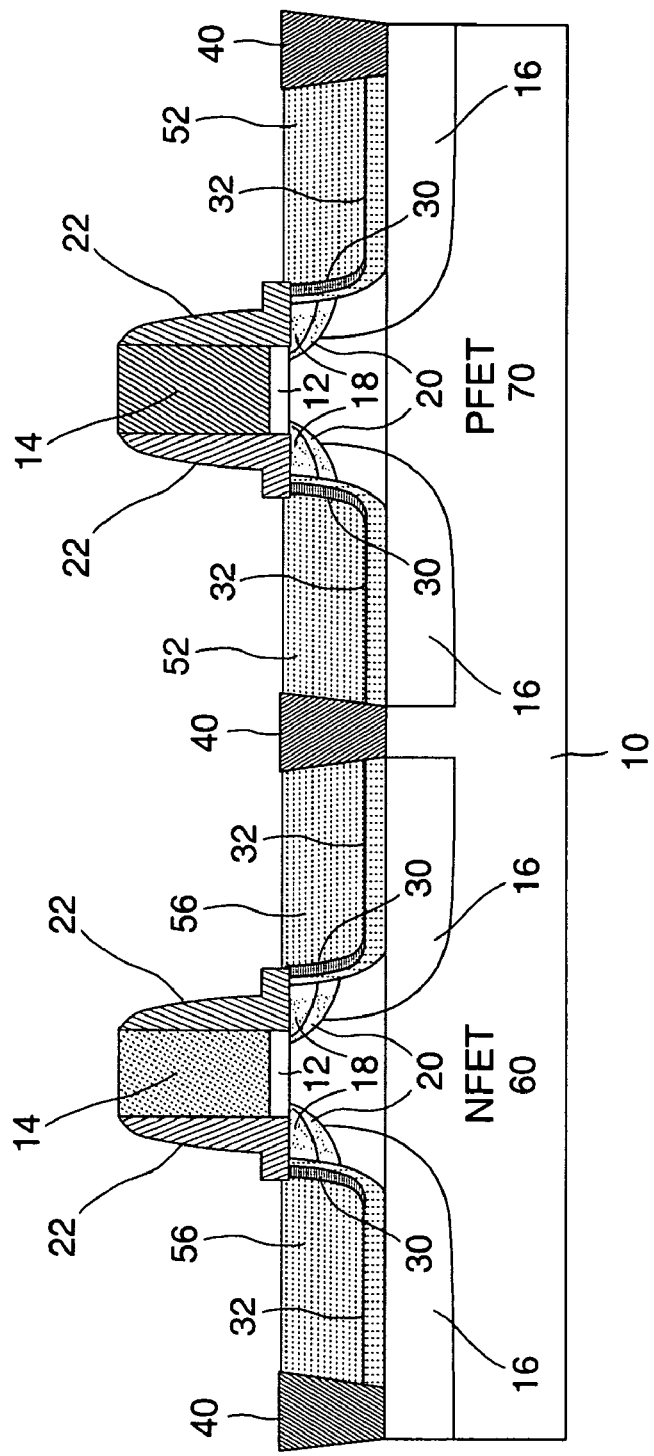
Figure 20:
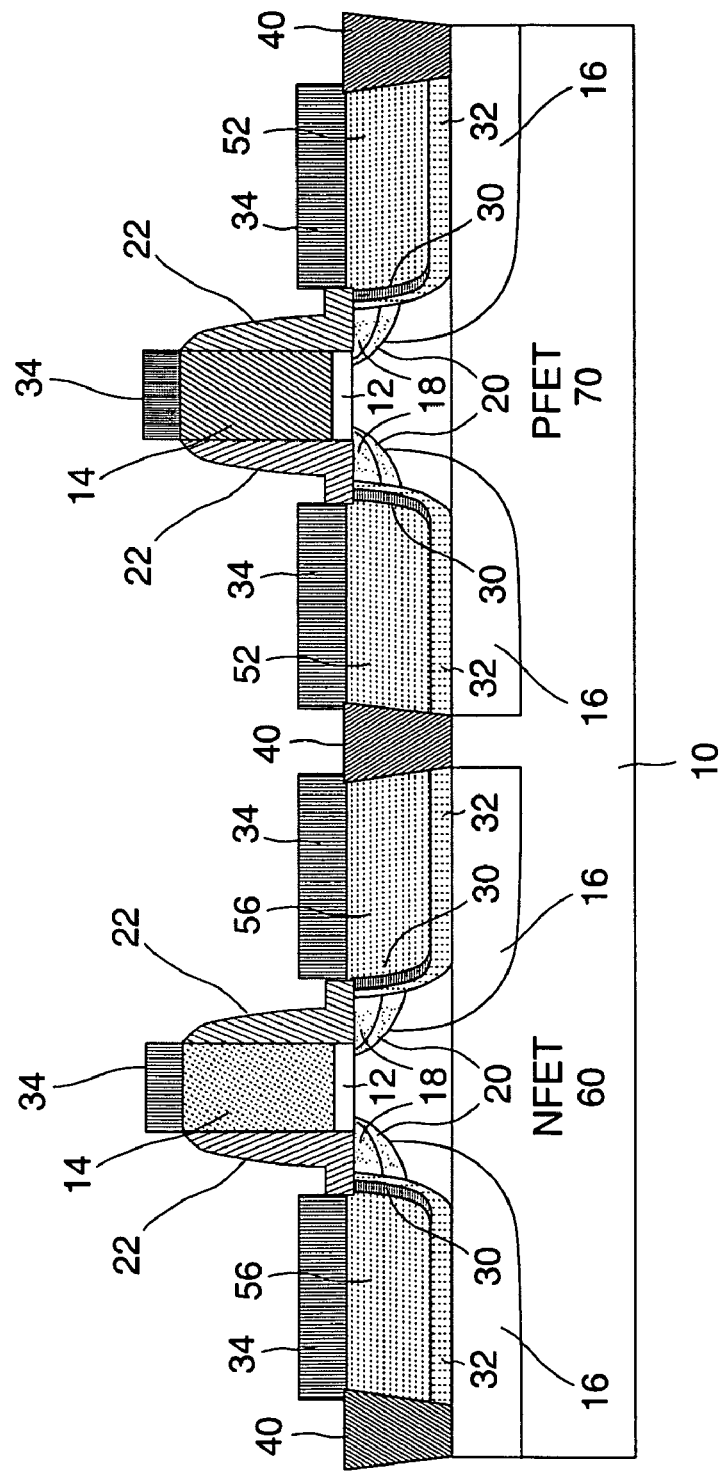

In FIG. 10 the recesses 26 are formed and in FIG. 11 the nickel barrier layer 30 is formed. Next, as shown in FIG. 12, the nickel barrier layer 30 is etched back so that nickel barrier structure 30 remains under the thick spacers 24. In FIG. 13 an $SiO_2$ capping layer 50 is deposited over the entire structure. The capping layer 50 is patterned in a conventional manner so that it remains over the NFET 60 but not over the PFET 70. Next, in FIG. 14, nickel barrier material 52 (e.g., e-SiGe) is formed on the exposed surfaces of the substrate 10 and nickel barrier layer 30 of the PFET 70. The nickel barrier material 52 may be undoped or doped with a p-type dopant such as boron. The use of a doped nickel barrier material 52 avoids the need for a separate implantation and annealing steps to form the source-drain regions 16 of the PFET 70. If the nickel barrier material 52 is undoped, then a separate boron implantation and anneal will be required to form the source-drain regions 16 of the PFET 70. In FIG. 15 the capping layer 50 is removed from the NFET and a second capping layer 54 is formed over the PFET 70 (FIG. 16). In FIG. 17, epitaxially grown silicon 56, undoped or with an n-type dopant such as phosphorus, is formed on the exposed surfaces of the substrate 10 and nickel barrier layer 30 of the NFET. The use of doped silicon avoids the need for a separate implantation and annealing steps to form the source-drain regions of the NFET 60. If the silicon 56 is undoped, then a separate phosphorus implantation and anneal will be required to form the source-drain regions 16 of the NFET. The second capping layer 54 is removed (FIG. 18), followed by removal of the hard mask 15 (FIG. 19). Finally, in FIG. 20, silicide layers 34 are formed, which as in previous embodiments of the invention, are NiSi layers.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a CMOS device, comprising:
    forming at least one patterned gate region atop a first semiconductor layer that includes silicon;
    forming dielectric spacers about exposed portions of the patterned gate region;
    forming source-drain regions in the first semiconductor layer;
    forming recesses in the first semiconductor layer that extends under the dielectric spacers, said first semiconductor layer having exposed surfaces that in part define sidewalls of the recesses;
    forming a nickel barrier layer on each of said exposed surfaces of the first semiconductor layer;
    etching the nickel barrier layers so that the nickel barriers remain only on portions of said exposed surfaces located under the dielectric spacers and not on remaining portions of said exposed surface;
    forming a silicon-containing layer on each of said remaining exposed surfaces of the first semiconductor layer; and
    forming silicide layers on said silicon-containing layers, wherein said silicide layer includes nickel.

2. The method of claim 1 wherein the CMOS device is an NFET.

3. The method of claim 2 wherein the CMOS device is an PFET and the silicon-containing layer includes Ge.

4. The method of claim 3 wherein said CMOS device is a PFET and said silicon-containing layer is doped with a p-type dopant.

5. The method of claim 1 wherein the nickel barrier layer comprises SiGe.

6. The method of claim 5 wherein the SiGe is epitaxial SiGe.

7. The method of claim 1 wherein the step of forming silicide layers comprises the steps of:
    depositing nickel or a nickel alloy on said silicon-containing layer; and
    annealing the nickel or nickel alloy to react with underlying silicon to thereby form the silicide layers.

* * * * *

UNITED STATES PATENT AND TRADEMARK OFFICE
CERTIFICATE OF CORRECTION

| | |
|---|---|
| PATENT NO. | : 7,078,285 B1 |
| APPLICATION NO. | : 11/040781 |
| DATED | : July 18, 2006 |
| INVENTOR(S) | : Suenaga |

It is certified that error appears in the above-identified patent and that said Letters Patent is hereby corrected as shown below:

Title Page, item [57] (57) Abstract, line 18, change last word "layer" to -- layers --.

Title page item [57] (57) Abstract, line 19, change first word "includes" to -- include --.

Col. 1, line 21, after "producing", delete "interest in".

Col. 1, line 34, after "including", change "opens", to -- openings, --.

Col. 1, line 48, after "as", change "$CoSi_2$" to -- $CoSi_2$. --.

Col. 1, line 64, after "result", insert -- , --.

Col. 1, line 65, after "located", insert -- adjacent --.

Col. 2, line 25, before "wherein", change "layers," -- layer, --.

Col. 2, line 26, change "layer includes" to -- layers include --.

Col. 2, line 30, before "PFET", change "an" -- a --.

Col. 2, line 43, after first word "view", insert -- , --.

Col. 2, line 44, after last word "layers", insert -- . --.

Col. 2, line 48, after "show", insert -- , --.

Col. 2, line 49, after first word "view", insert -- , --.

Col. 2, line 52, after "show", insert -- , --.

Col. 4, line 30, after "halo", delete -- implant --.

Col. 5, line 33, delete first word "an".

Col. 5, line 33, delete last word "23".

Col. 5, line 45, after "that", change "services" to -- serves --.

Col. 5, line 66, after "minimum", insert -- , --.

UNITED STATES PATENT AND TRADEMARK OFFICE
CERTIFICATE OF CORRECTION

PATENT NO. : 7,078,285 B1
APPLICATION NO. : 11/040781
DATED : July 18, 2006
INVENTOR(S) : Suenaga It is certified that error appears in the above-identified patent and that said Letters Patent is hereby corrected as shown below:

Col. 6, line 31, after "of", delete "a".

Col. 6, line 50, before "16", insert -- source-drain regions --.

Col. 6, line 51, after "in", insert -- this --.

Col. 6, line 51, after "way", insert -- , --.

Col. 7, line 21, after "an", change "Sio$_2$" to -- SiO$_2$ --.

Col. 7, line 30, after "annealing", change "steps" to -- step --.

Col. 7, line 41, change first word "steps" to -- step --.

Claim 1, Col. 8, line 31, after "silicide", change "layer includes" to -- layers include --.

Claim 3, Col. 8, line 34, change last word "an" to -- a --.

Signed and Sealed this

Twenty-third Day of January, 2007

JON W. DUDAS
*Director of the United States Patent and Trademark Office*